United States Patent
Levy et al.

(10) Patent No.: US 6,570,139 B1
(45) Date of Patent: May 27, 2003

(54) ELECTRONIC CONTROL CIRCUIT

(75) Inventors: William Levy, Hopedale, MA (US); Robert A. Sherwood, El Paso, TX (US)

(73) Assignee: The Holmes Group, Inc., Milford, MA (US)

( * ) Notice: Subject to any disclaimer, the term of this patent is extended or adjusted under 35 U.S.C. 154(b) by 0 days.

(21) Appl. No.: 09/844,995

(22) Filed: Apr. 27, 2001

Related U.S. Application Data

(60) Provisional application No. 60/200,586, filed on Apr. 28, 2000.

(51) Int. Cl.[7] ............................................. H05B 1/02
(52) U.S. Cl. ................... 219/506; 219/507; 219/483; 392/373; 392/383
(58) Field of Search ............................... 219/506, 507, 219/501, 494, 483, 497; 392/360–364, 373, 380, 385, 370

(56) References Cited

U.S. PATENT DOCUMENTS

| | | | | |
|---|---|---|---|---|
| 1,528,300 A | * | 3/1925 | Noonan ............... | 219/508 |
| 4,365,141 A | * | 12/1982 | Weiss ................ | 219/370 |
| 4,711,988 A | * | 12/1987 | Thaler et al. ........ | 219/364 |
| 5,467,423 A | * | 11/1995 | Jakubowski ........... | 219/220 |

FOREIGN PATENT DOCUMENTS

EP 0057277 * 12/1981

OTHER PUBLICATIONS

Holmes, "Twin Window Fan", HAWF–2095, Holmes Product Corporation, 1997.
Holmes, "Accuset™ Warm Mist Humidifier", HAWF–5700, Holmes Product Corporation, 1998.

* cited by examiner

*Primary Examiner*—Mark Paschall
(74) *Attorney, Agent, or Firm*—Hoffmann & Baron, LLP

(57) ABSTRACT

An electronic control circuit for use with a heater, a fan, a humidifier or any device utilizing a power mode switch and a condition sensor, the electronic control circuit including a single control switch for controlling both power output and responding to a sensed condition. The electronic circuit includes a microprocessor, preferably in the form of an application-specific integrated circuit to provide the circuit logic. The single control switch is preferably a push-button switch which places the unit in the selected mode of operation. The electronic control circuit also includes a thermistor or humidity sensor to sense conditions and, depending upon the set temperature/humidity by the control switch and the sensed condition the unit will operate accordingly. The unit can also operate in a manual mode, thereby bypassing the sensor operation.

20 Claims, 8 Drawing Sheets

ELECTRONIC CONTROL CIRCUIT

PRIORITY APPLICATIONS

This application claims the benefit of U.S. Provisional Application No. 60/200,586, filed on Apr. 28, 2000.

BACKGROUND OF THE INVENTION

1. Field of the Invention

The present invention relates to an improved electronic control circuit, and more particularly, to an electronic control circuit which provides the functions of a multi-position power switch and a sensor device to control operation of an apparatus.

2. Description of Prior Art

Presently available electric space heaters and electric fans for domestic use are generally provided with at least two control components. The first control component is a multi-position power switch to select a proper setting, e.g. off/high/medium/low. The second control component is a thermostat to de-energize the device when a predetermined, pre-set temperature value is achieved. Likewise currently available humidifiers are provided with a similar multi-position power switch and, rather than a thermostat, are provided with a humidistat to sense when a predetermined, pre-set humidity level is achieved.

The present multi-position power switches and mechanical thermostats/humidistats are expensive, unreliable, and mechanically complex. Additionally, these components constitute as a major portion of the cost and complexity in making and using low cost heaters, fans and humidifiers. Furthermore, the mechanics of these components tend to render them the most oft failed components in the device. More specifically, each component requires a control knob and individual wiring connections, which are labor intensive and points of potential failure.

OBJECTS AND SUMMARY OF THE INVENTION

It is an object of the present invention to provide an electronic control device in a heater, a fan or a humidifier which eliminates the use of complex switches and reduces wiring connections to improve reliability.

It is yet a further object of the present invention to provide an electronic control device in a heater, a fan or a humidifier which is simple to construct thereby reducing complexity of construction and lowering the cost of same.

It is yet a further object of the present invention to provide an electronic control device in a heater, a fan or a humidifier which improves the reliability of the operation.

It is still another object of the present invention to provide a solid state electronic control device which uses a single actuator to set a desired operating level (high, medium, or low) as well as a predetermined temperature/humidity value at which power to the unit is to be terminated.

It is another object of the present invention to provide an electronic control circuit for use in a heater, a fan or a humidifier which uses a single push button to both turn the unit on, set an operating power level and set a predetermined threshold temperature/humidity value to achieve by operation of the unit.

In accordance with one form of the present invention, an electronic control circuit is provided for operating a device such as a heater, a fan, a humidifier or any other device which includes an operating power level and a pre-set value for comparison with a sensor device. The electronic control circuit includes a single control switch for turning on the device and selecting a mode of operation. The mode of operation includes both a power level of operation and one of a plurality of pre-set values. The sensor is provided for sensing a condition. The electronic control circuit further includes a comparator for comparing the sensed condition to the selected pre-set value. The electronic control circuit includes a means for providing operating power to the device in response to an output from the comparator. In a preferred embodiment, the single control switch is a push-button switch. Furthermore, the means for providing operating power to the device includes an application-specific integrated circuit.

In one embodiment, the electronic control circuit is used in an apparatus for modifying ambient air conditions. The apparatus includes a housing, a fan assembly positioned within the housing and including a motor and a fan blade attached to the shaft of the motor. The apparatus further includes an electronic control circuit electrically coupled to the motor and adapted to provide power thereto. The electronic control circuit has a single switch to turn on operating power to the apparatus and to select a pre-set threshold ambient air condition. The electronic control circuit further includes a sensor for sensing an ambient air condition and a means for comparing the pre-set threshold ambient air condition to the sensed ambient air condition. The electronic control circuit provides power to the fan assembly motor to substantially achieve the pre-set threshold ambient air condition in view of an output of the comparing means and terminates power to the fan assembly motor when the pre-set threshold ambient air condition is substantially attained. Preferably, the switch is a push-button switch and the electronic control circuit includes a plurality of discretely incremented pre-set threshold ambient air condition values which can be selected by repeatedly activating the switch. The apparatus further includes indicia, such as light emitting diodes, to indicate both the power level of operation and the selected pre-set threshold ambient air condition.

The logic for the electronic control circuit is provided by an application-specific integrated circuit to control power to the apparatus motor and to illuminate the indicia associated with the mode of operation. The sensor may comprise a thermistor in the case of a fan, a heater, a griddle, or the like or a humidity sensor for use with a humidifier. With respect to humidifiers, the electronic control circuit can be used with either a cool mist humidifier which utilizes a fan and a wick filter immersed in a pool of water or with a warm mist humidifier which includes a heating element for creating steam to be released to the surroundings.

The present invention is also directed to a method of operating an apparatus for modifying an ambient air condition. The apparatus includes either a heating element or a fan assembly wherein the fan assembly includes a motor and a fan blade coupled to the shaft of the motor. The electronic control circuit is electrically coupled to either the heating element or the fan motor, or both, for providing operating power thereto. The electronic control circuit includes a single control switch and a sensor for sensing an ambient condition. The apparatus is operated by actuating the single control switch to turn on the apparatus and to select an operating power level and a pre-set threshold ambient air condition value. The pre-set threshold ambient air condition is compared to the sensed ambient air condition and operating power is provided to the heating element, the motor or both if the sensed ambient air condition is not substantially similar to the pre-set ambient air condition. Power is terminated to the device when the sensed ambient air condition is substantially similar to the pre-set threshold ambient air condition. The method further includes repeatedly actuating the switch to progress through a plurality of operating modes and pre-set threshold ambient air condition values.

A preferred form of the electronic control circuit, as well as other embodiments, objects and advantages of this invention, will be apparent from the following detailed description of the illustrative embodiments thereof, which is to be read in connection with the accompanying drawings.

DETAILED DESCRIPTION OF THE PREFERRED EMBODIMENTS

Figure 1:
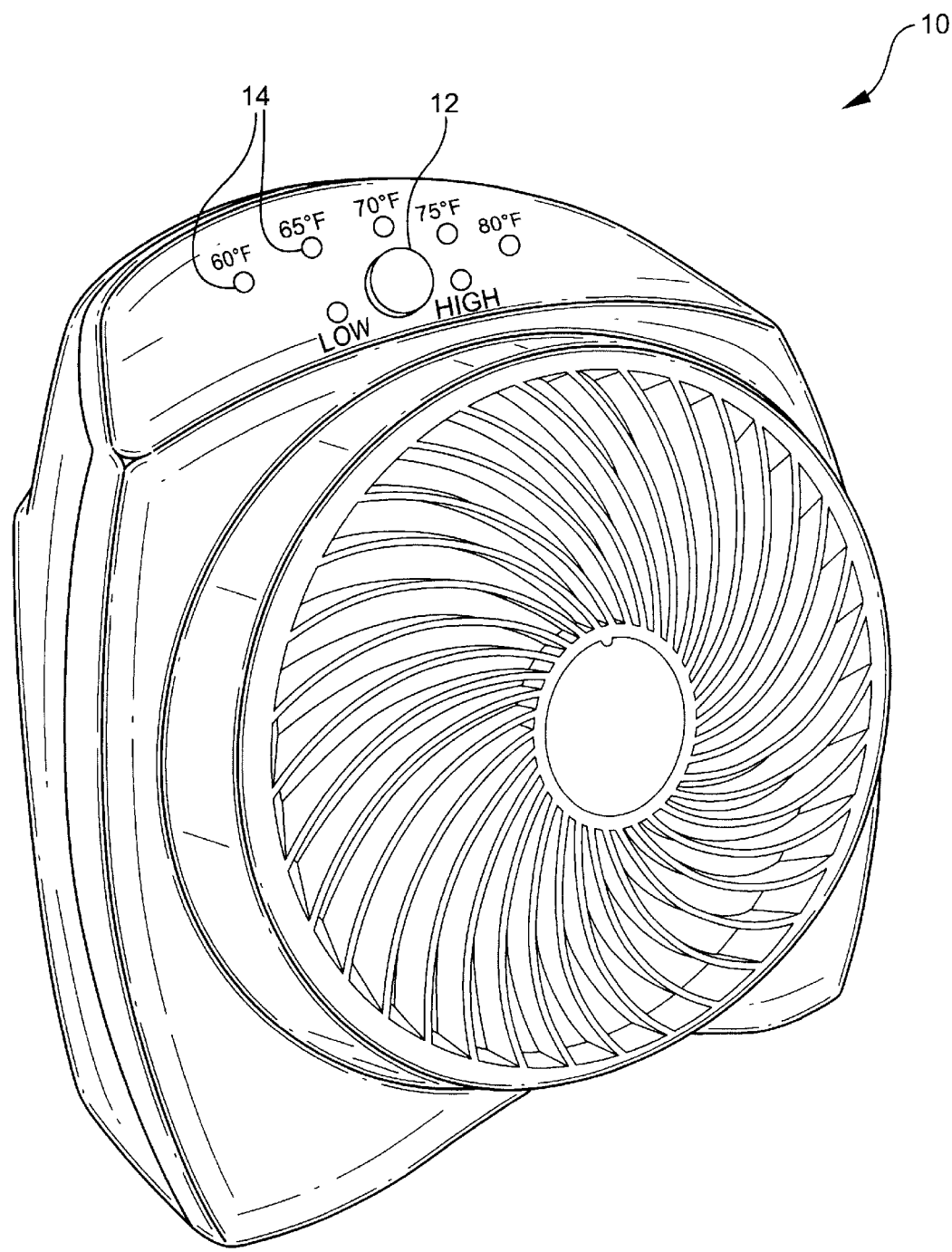
FIG. 1 is a perspective view of a heater including a first embodiment of the electronic control device of the present invention.

Referring to FIG. 1, a heater is shown utilizing a first embodiment of the electronic control device of the present invention. Although, FIG. 1 illustrates a heater, it is envisioned that the electronic control circuit of the present invention is equally adaptable to be used in a fan including a thermostat or a humidifier including a humidistat. For example, the same device illustrated in FIG. 1 may be operated as a fan with a thermostat by removing the heating element from the unit. A typical structure for a window fan including a thermostat is disclosed in commonly owned U.S. Pat. No. 5,660,605 entitled "Window Fan", the disclosure of which is incorporated herein by reference. Likewise, a cool mist humidifier may be operated which uses a wick filter and a fan to draw air through the filter to add moisture to the surroundings using a similar electronic control circuit. The structure of a cool mist humidifier is disclosed in commonly owned U.S. Pat. No. 5,529,726 entitled "Evaporative Humidifier", the disclosure of which is incorporated herein by reference. Similarly, the electronic control circuit can be employed in a warm mist humidifier having a humidity sensor. A typical structure for a warm mist humidifier is disclosed in commonly owned U.S. Pat. No. 5,792,390 entitled "Humidifier with Top Fill Tank", the disclosure of which is incorporated herein by reference. It is contemplated that the single-button electronic control circuit disclosed herein is also capable of operating any type of unit which requires both power level control and achieving a set temperature, such as an electric cooking device. For example, the electronic control circuit of the present invention is useful in controlling an electric griddle which includes a heating element and a set temperature value.

In the embodiment of FIG. 1, the electronic control circuit includes a single switch, namely a push-button switch having a manual and automatic mode of operation. It is also envisioned that other types of switches can be used, however, a push-button switch allows for easy operation and is low in cost. More specifically, in the manual mode, the device, e.g. a heater, a fan or a humidifier, can be operated at either high, medium, or low power regardless of the ambient temperature or humidity level. Alternatively, the device may be operated in an automatic mode based upon a sensed temperature/humidity and a predetermined threshold temperature or humidity set point or value set by the user. For example, in the case of a heater, the automatic mode may include a temperature set point of 70° F. If the unit is set in automatic mode to 70° F., the heater will operate at a selected power level, until ambient temperature sensed by a thermostat reaches 70° F. Once the set point temperature is attained, the electronic control device of the present invention de-energizes the unit until the sensed temperature once again falls below the set point temperature and the unit is once again turned on. As noted earlier, the same type of electronic control circuit is equally applicable to a fan equipped with a thermostat or a humidifier equipped with a humidistat.

Referring again to FIG. 1, the heater 10 includes a push-button switch 12 to operate the electronic control circuit. A series of light-emitting diodes (LED's) 14 are provided around the periphery of the push-button switch 12 to provide a visual indication as to the mode and setting of operation of the unit. The single push-button switch and associated circuitry replaces the functions of previously used multi-position switches and thermostats/humidistats.

Figure 2:
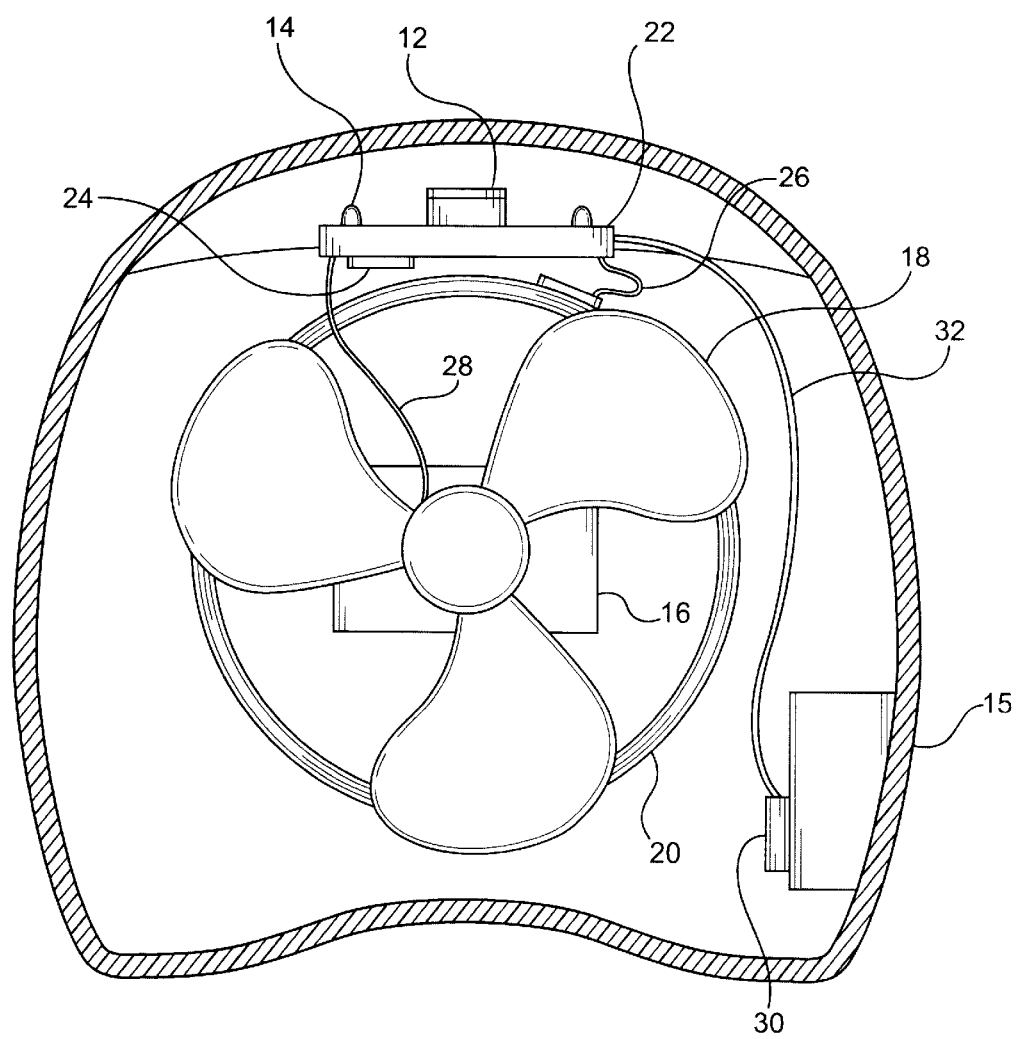
FIG. 2 is a cross-sectional view of the heater illustrated in FIG. 1.

FIG. 2 is a front cross-sectional view of FIG. 1 illustrating the components of the heater 10. The heater includes a heater housing 15 for supporting therein a fan assembly comprising a motor 16 and a fan blade 18. The motor 16 includes a shaft (not shown) which is mechanically connected to the center hub of the fan blade to rotate the blade producing air flow which exists the front grille. It is envisioned that the fan assembly may take any known form so long as air is drawn across the heating element for discharge to the surroundings. The heater 10 also includes a heating element 20 to produce the heated air to be discharged from the unit. In this illustration, the heating element is in the form of a circular element, however, many different types of heating elements may be used as is well known by those of ordinary skill.

The heater 10 uses an electronic control circuit to operate the heating element and fan. As illustrated in FIG. 2, the electronic control circuit is preferably in the form of a printed circuit board 22 having a logic circuit in the form of an application-specific integrated circuit (ASIC) 24 programmed to perform the specific logic of the electronic control circuit to operate the heater. The ASIC 24 is electronically coupled to both the heating element and fan motor via printed traces on the circuit board as well as wires, 26 and 28, respectively. The electronic control circuit also includes a thermostat 30 coupled to the ASIC 24 via wires coupled to the printed circuit board 22. The thermostat 30 senses ambient air temperature and provides the information to the microprocessor for comparison to the predetermined threshold temperature set by the user via the push-button switch.

Figure 3:
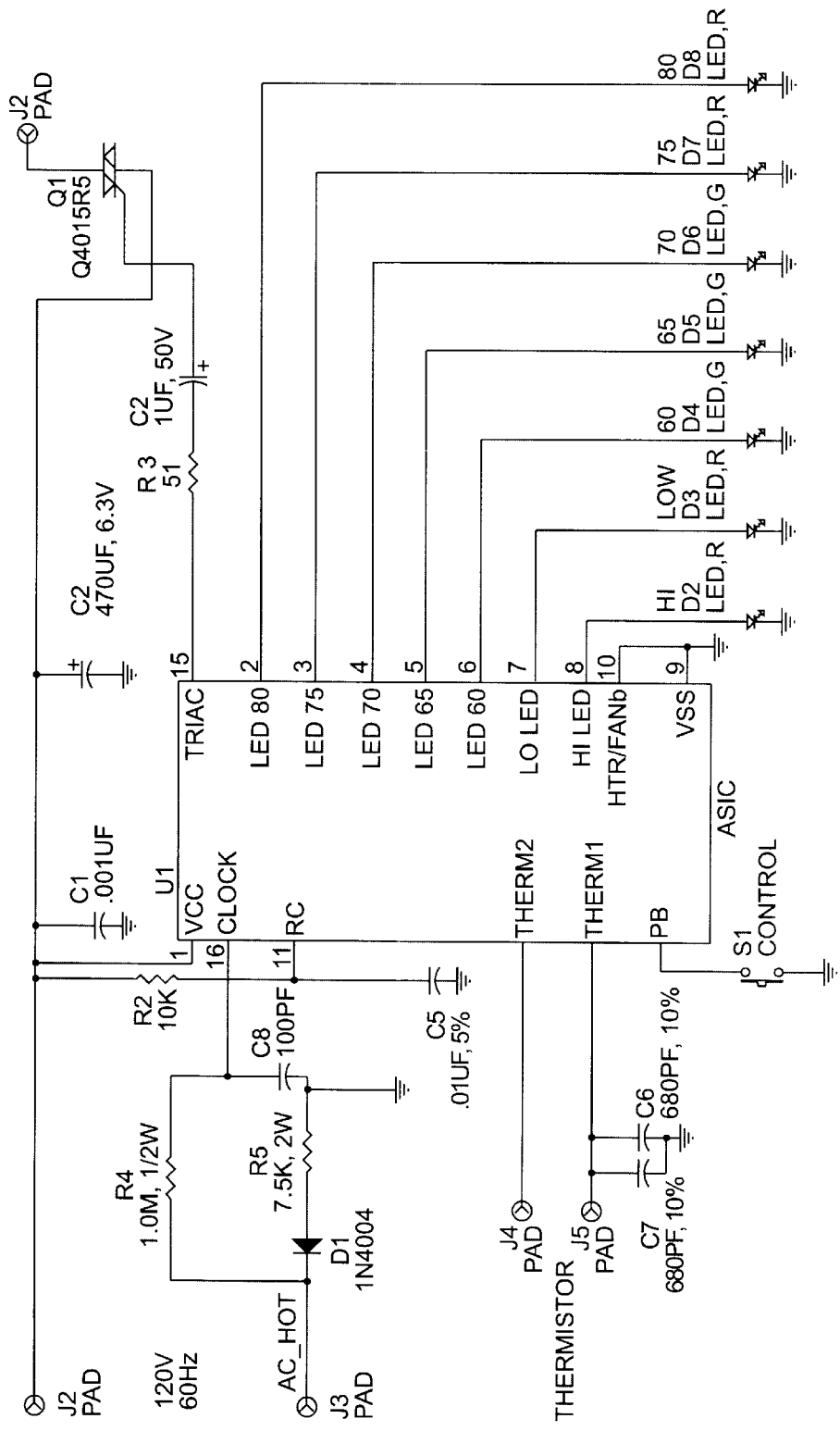
FIG. 3 is an electrical schematic of the electronic control circuit for the heater illustrated in FIGS. 1 and 2.

FIG. 3 illustrates the electronic control circuit for use with a heater. The ASIC U1 is a collection of logic circuits having the specific logic required for operation provided therein. A suitable ASIC is produced by The Holmes Group, Inc., a Massachusetts Corporation under Part No. "Holmes Accutemp ASIC".

Furthermore, the ASIC includes a comparator for comparing the sensed ambient temperature/humidity value to the pre-set value selected by the user. The electronic control device circuit also includes a triac trigger circuit to provide power to the unit being operated. Contrary to a microprocessor which can be programmed to perform a variety of functions, the ASIC is designed to perform the specific functions for which it is programmed. Accordingly, ASIC's are typically lower in unit costs and provide higher performance by eliminating the circuit from the chip needed to make it programmable and incorporating just those logic functions needed for the application. The higher performance comes from directly implementing the logic instead of using an instruction set requiring multiple clock pulses to execute.

As illustrated in FIG. 3, the heater uses a single push-button control switch S1 to control operation of the unit and seven (7) LED's to indicate the mode of operation. Naturally, other types of control switches and varying numbers of LED's may be used depending upon the number of modes and settings chosen by the designer. The ASIC microprocessor U1 uses the input A/C power from a standard 120 volt, 60 Hz outlet to perform timing functions and to determine when to fire a triac Q1 that controls operation of the heating element and fan assembly. The input power is provided to the electronic control circuit via pads J2 and J3 on the printed circuit board. The hot A/C input is passed through a power supply rectifier which includes components D1 and R5 arranged as shown in FIG. 3. It should be noted that diode D1 is arranged to provide negative voltages to the ASIC U1 at pin 9 labeled VSS. Resistor R5 provides current regulation and resistor R4 provides a sample of the AC line frequency to determine when to fire the triac and for internal timing function. The A/C neutral is provided to the pin 1, VCC, of the ASIC U1. Negative going pulses on pin 15 labeled TRIAC of the ASIC UI fire the triac Q1. The A/C neutral is also provided to the triac Q1. Capacitor C1 protects the ASIC from transients on the A/C power line. Capacitor C2 acts as a filter capacitor for the power supply to reduce ripple thereon.

The ASIC U1 further includes an internal oscillator, whose frequency is determined by an external RC network, R2 and C5 coupled to pin 11. The RC network is used to generate a higher frequency for operations that require smaller time increments than can be obtained from the input 60 Hz line through pin 16 labeled CLOCK. The electronic control circuit has been engineered to draw a relatively constant current, regardless of the mode of operation. Therefore, no voltage regulation is required. Furthermore, by changing the value of resistor R2, the frequency of the internal oscillator can be changed thereby delaying the firing of the triac in the low power mode of operation. Thus, the ASIC U1 can be used in a wider range of applications.

The electronic control circuit further includes a thermistor T1 coupled to the ASIC microprocessor U1 via printed circuit board pads J4 and J5. Capacitors C6 and C7 along with thermistor T1, set the frequency of an oscillator inside the ASIC. As the temperature changes the value of thermistor T1, the oscillator frequency changes thus enabling the ASIC to measure temperature.

The ASIC U1 also includes outputs to each of the LED indicators which provide visual indicia as to the mode of operation of the heater. Two LED's provide indication of the power level, either high (D2) or low (D3) and the remaining LED's provide indication as to the predetermined threshold temperature at which the heater will be turned on, i.e., 65° F. through 80° F. in 5° increments, D4–D8, respectively.

As discussed earlier, the ASIC and associated electronic control circuit can be used to operate either a heater, a fan or a humidifier. To accomplish this function, the ASIC U1 includes a programming pin that can be tied to either the DC power voltage or ground thereby identifying whatever the ASIC is operating, a heater or a fan. A similar circuit may be used in a cool mist humidifier by exchanging the thermistor with a humidity sensor.

The ASIC logic also permits the heater to be operated in a manual mode, i.e. constant operation at a selected power level or in an "automatic"mode using the input from the thermistor to determine if the set threshold temperature has been reached and only operate the heater and fan by firing the triac when the temperature is below or above the set temperature, respectively.

Operation of the heater using the push-button switch S1 requires a series of pushes of the switch to proceed through the sequence of options available. When power is first applied to the electronic control circuit by plugging the unit into the wall outlet, an internal power on reset circuit in the ASIC turns off all external signals. The first push of the control button or switch places the heater in manual high power mode lighting the high LED and causing a pulse to fire the triac near the zero crossing of the A/C power. In case of a large fan which has a larger fan motor providing an inductive load, a second pulse is also generated approximately 2.2 m sec. after the zero crossing so that the triac can be turned on when enough holding current is present to keep it on.

A second push of the control button places the heater in the manual operation low power level mode thereby lighting the low LED. The triac is fired with a delay sent by the frequency of the RC oscillator as determined by the values of resistor R2 and capacitor C5 to place the unit in the low power mode of operation.

A third push on the control button places the heater in the "automatic" mode at high power. Specifically, the "automatic" mode is defined as operating to a predetermined set point and comparing the set temperature with the sensed ambient temperature of the thermistor. This third push lights both the high LED and 80° F. LED and sets a thermostat temperature of 80° F. In this mode, when operating as a heater controller, the triac fires when sensed ambient temperature is below 79° F. thereby supplying power to the heating element and fan motor. The triac does not fire when the ambient temperature is above 81° F. and the heater remains off until the temperature drops below 79° F. If the electronic control circuit were controlling a fan, the triac would be turned on when the sensed ambient temperature rises above the set temperature and turns off when sensed ambient temperature drops below the set temperature. The off and on limits are one degree above and below the set temperature to prevent the unit from cycling on and off repeatedly.

Subsequent pushes of the control button changes the temperature setting in five degree increments as follows: 75° F., 70° F., 65° F., and 60° F. Following the high power level, 60° F. setting, the next push causes the heater to go into the low power level mode and the 80° F. temperature setting. Accordingly, in this setting, the heater operates at low power to achieve and maintain a sensed ambient temperature of 80° F. Thus, the low LED is lit as well as the 80° F. LED. Subsequent pushes of the control button moves the set temperature through the set increments at low power levels until the low power, 60° F. mode is reached. The next push on the control button places the electronic control circuit and the ASIC in the "off" mode and turns off all LED's and stops firing the triac.

As a matter of convenience, at any time during the setting sequence, if the push button is held down for more than one (1) second in any mode of operation, the electronic control circuit enters the "off" mode. When the control button is pushed again, the electronic control button is pushed again, the electronic control circuit and ASIC returns to the mode setting it was in prior to being turned off by the prolonged push of more than (1) second.

Furthermore, as discussed above, the electronic control circuit ASIC logic provides for a range of temperature around the set point temperature in which the operation of the unit begins and is terminated. More specifically, in the case of a heater, the sensed ambient temperature must be at least one degree above the set temperature before the unit will shut off. Likewise, the temperature must be at least one degree below the set temperature for the unit to turn on. Otherwise, the unit would turn on and off excessively around the set temperature.

Figure 4:
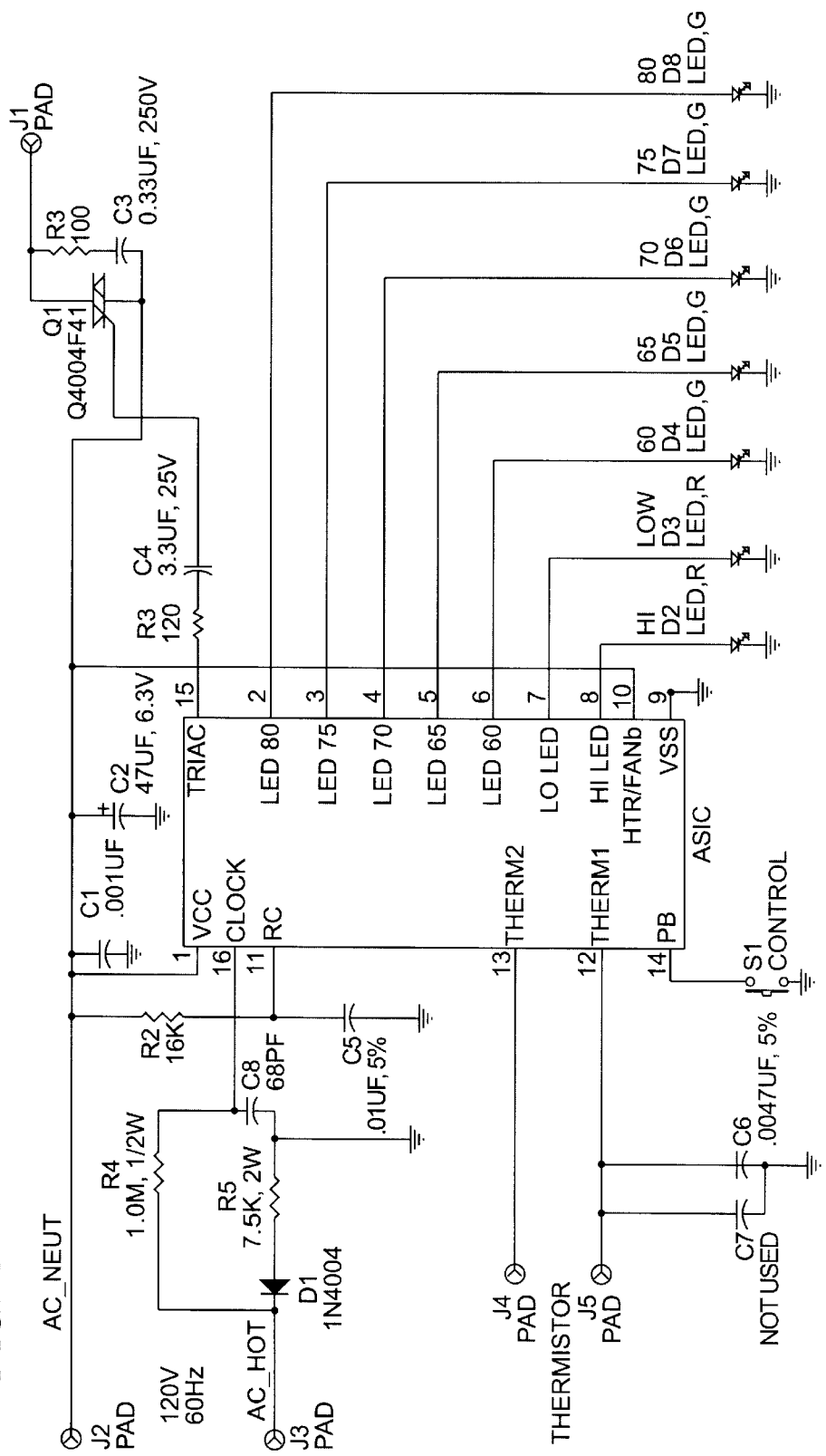
FIG. 4 is an electrical schematic of the electronic control circuit for use with a box fan.

FIG. 4 is an electrical schematic of an electronic control circuit of the present invention for use with a box fan. Like components from the schematic of FIG. 3 have the same reference designations. However, the values for some of the components have been adjusted to be more suitable for use with the inductive load of a fan. For example, capacitor C7 is no longer needed and an RC network including resistor R1 and capacitor C3 has been added in parallel to the firing triac to compensate for the inductive load of the fan. With respect to operation of the box fan, an identical sequence of activations of the push button switch, i.e. control button, yields identical modes of operation. It should also be noted that pin 10 of the ASIC is no longer tied to pin 9 and ground thereby operating the ASIC in the "fan" mode rather than the "heater" mode.

Figure 5:
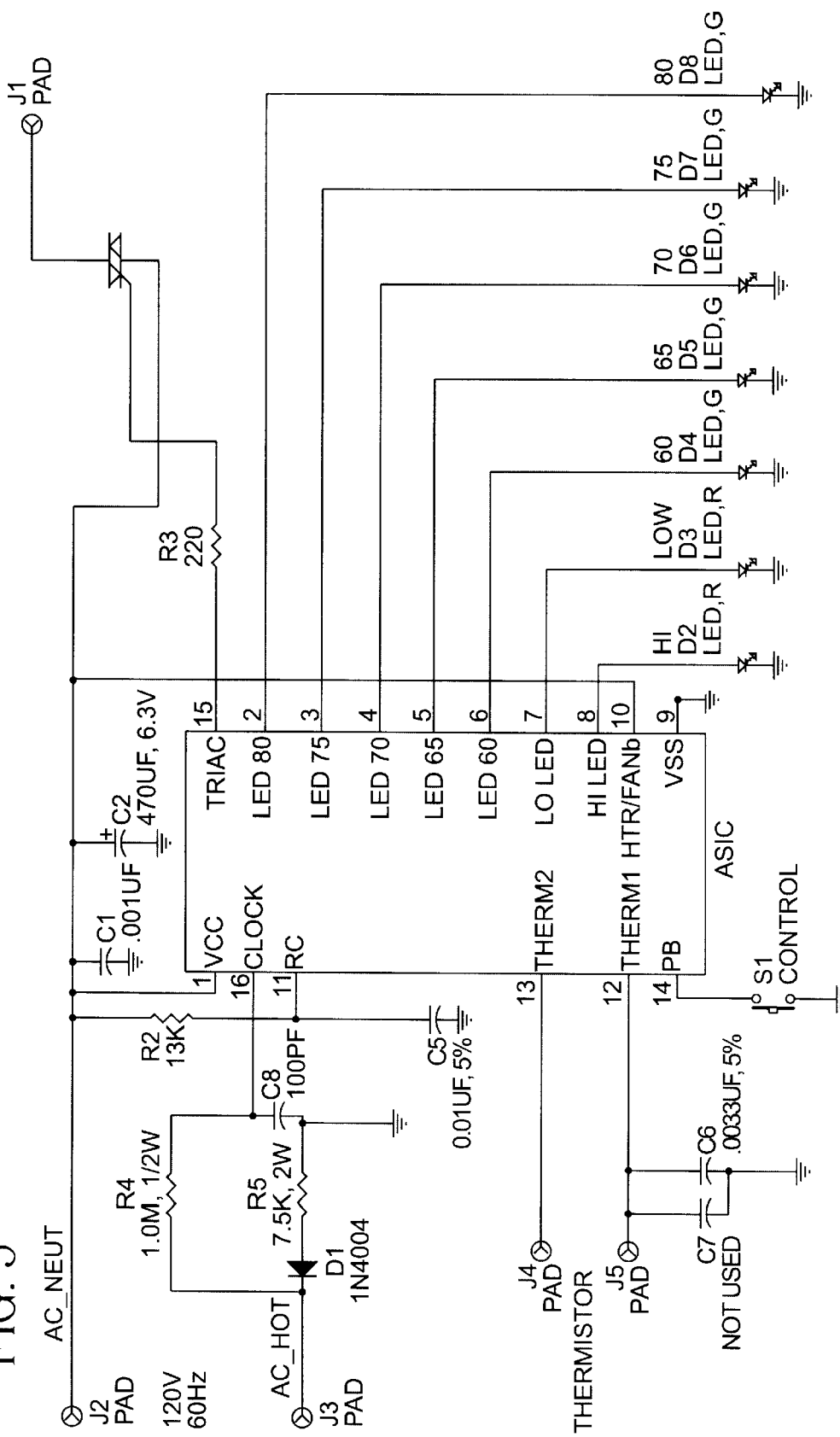
FIG. 5 is an electrical schematic of the electronic control circuit for use with a window fan.

FIG. 5 is an electrical schematic of an electronic control circuit of the present invention for use with a window fan. Once again, like components of different values from FIGS. 3 and 4 have the same reference designation. Since the window fan motor is not a large inductive load, there is no need for the RC network in parallel with the firing triac used in connection with box fan application of the circuit.

Figure 6:
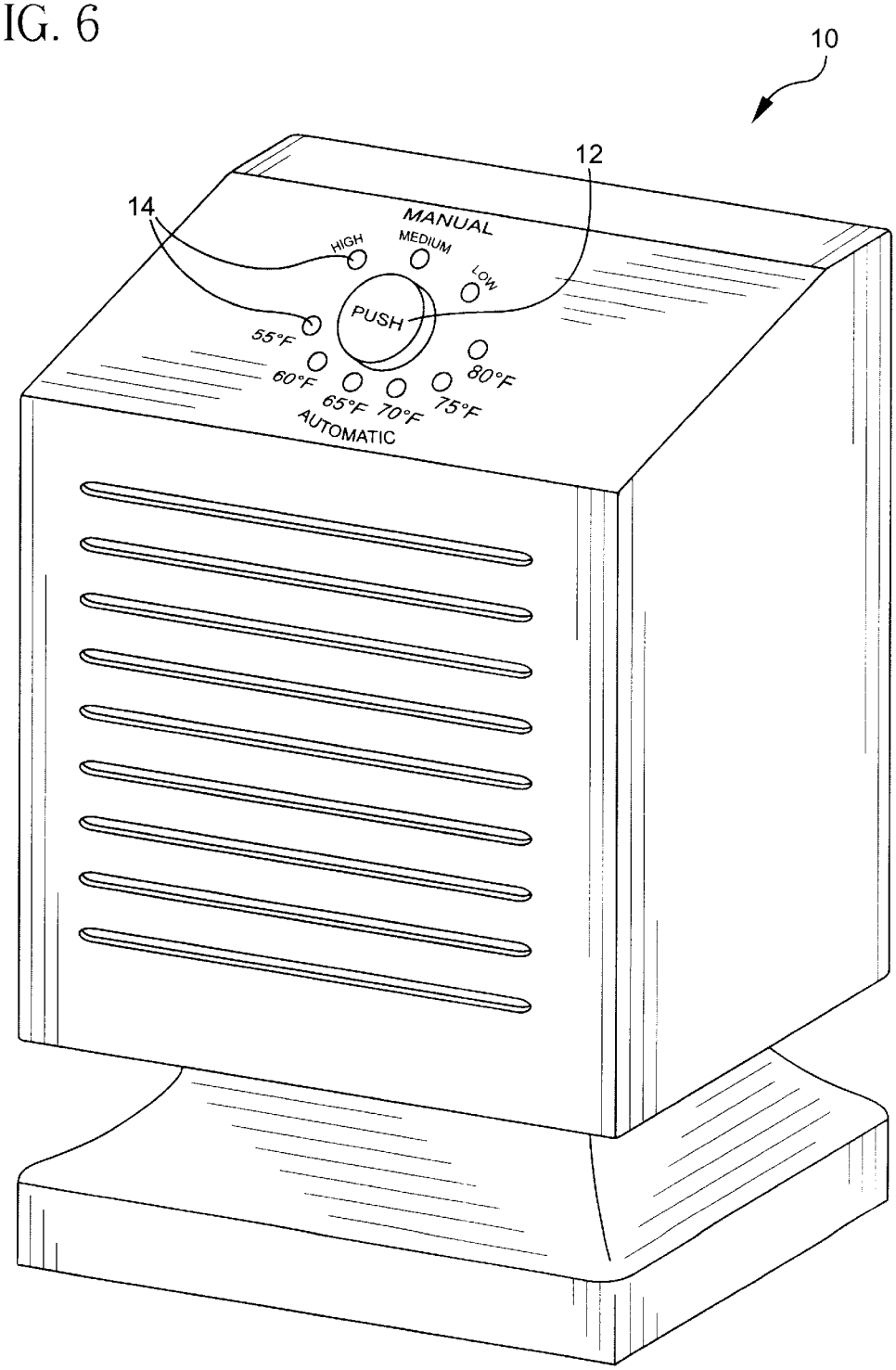
FIG. 6 is an alternative embodiment of the heater formed in accordance with the present invention.
Figure 7:
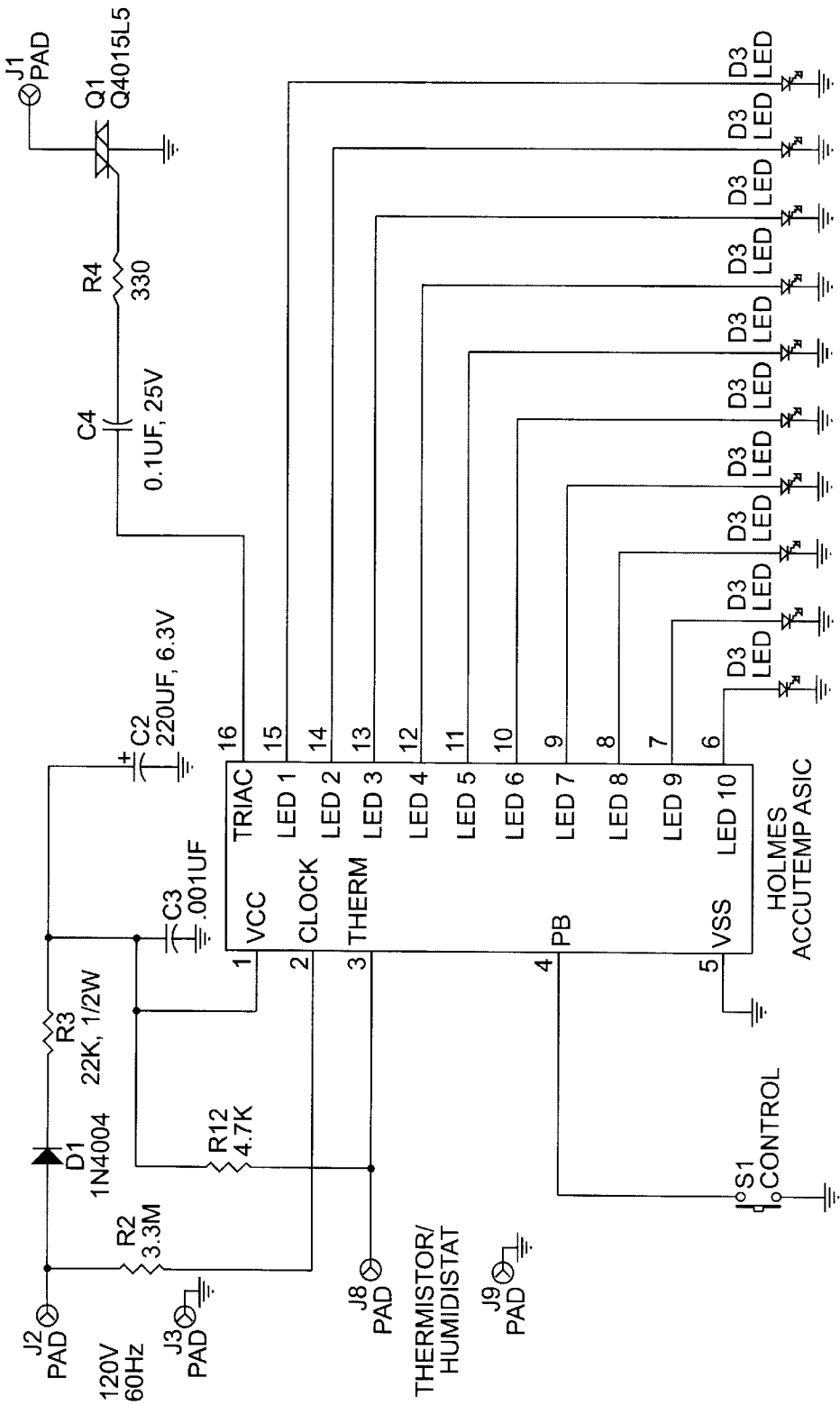
FIG. 7 is an electrical schematic of the electronic control circuit for the heater illustrated in FIG. 6.

FIG. 6 is an alternative embodiment of a heater using the single control switch and electronic control circuit as illustrated in FIG. 7. In this embodiment, the heater has three power level settings, high, medium and low and an additional temperature setting of 55° F. It is contemplated as part of the present invention to have any given number of power level settings as well as any given number of temperature/ humidity settings.

The heater illustrated in FIG. 6 having the electronic control circuit shown in FIG. 7 operates by repeated pushing of the push-button through the following sequence of operating conditions:

Originally in "off" position;

First push, provides continuous operation and a high power setting regardless of temperature with the corresponding high LED illuminating;

Second push provides continuous operation at medium power setting regardless of temperature with the corresponding medium LED illuminating;

Third push provides, continuous operation on low power setting regardless of temperature with the corresponding low LED illuminating;

Fourth push provides operation at a predetermined power level when ambient temperature is less than 55° F.; if sensed ambient temperature is greater than 55° F., power to the heating element and fan is terminated until sensed ambient temperature falls below 55° F. Subsequent pushes moves the sequence through the incremented temperature settings until the 80° F. mode is reached. The next push turns unit off.

As illustrated in FIG. 6, the LED's are individually labeled according to each of the above-identified operating conditions. Only the appropriate LED is illuminated at any given time.

Although the electronic control circuit may be constructed of discrete logic components, in order to be cost effective and most reliable, the electronic control circuit of the present invention is preferably in the form of a printed circuit board including a microcontroller and more preferably in the form of an ASIC having the driving software customized thereon.

FIG. 7 is an electrical schematic of the electronic control circuit of an alternative embodiment utilizing an ASIC to achieve the desired functions. In the electrical schematic of FIG. 7, it is assumed that the ASIC includes an analog to digital converter and an internal oscillator. The circuit also uses a voltage regulator D1.

Figure 8:
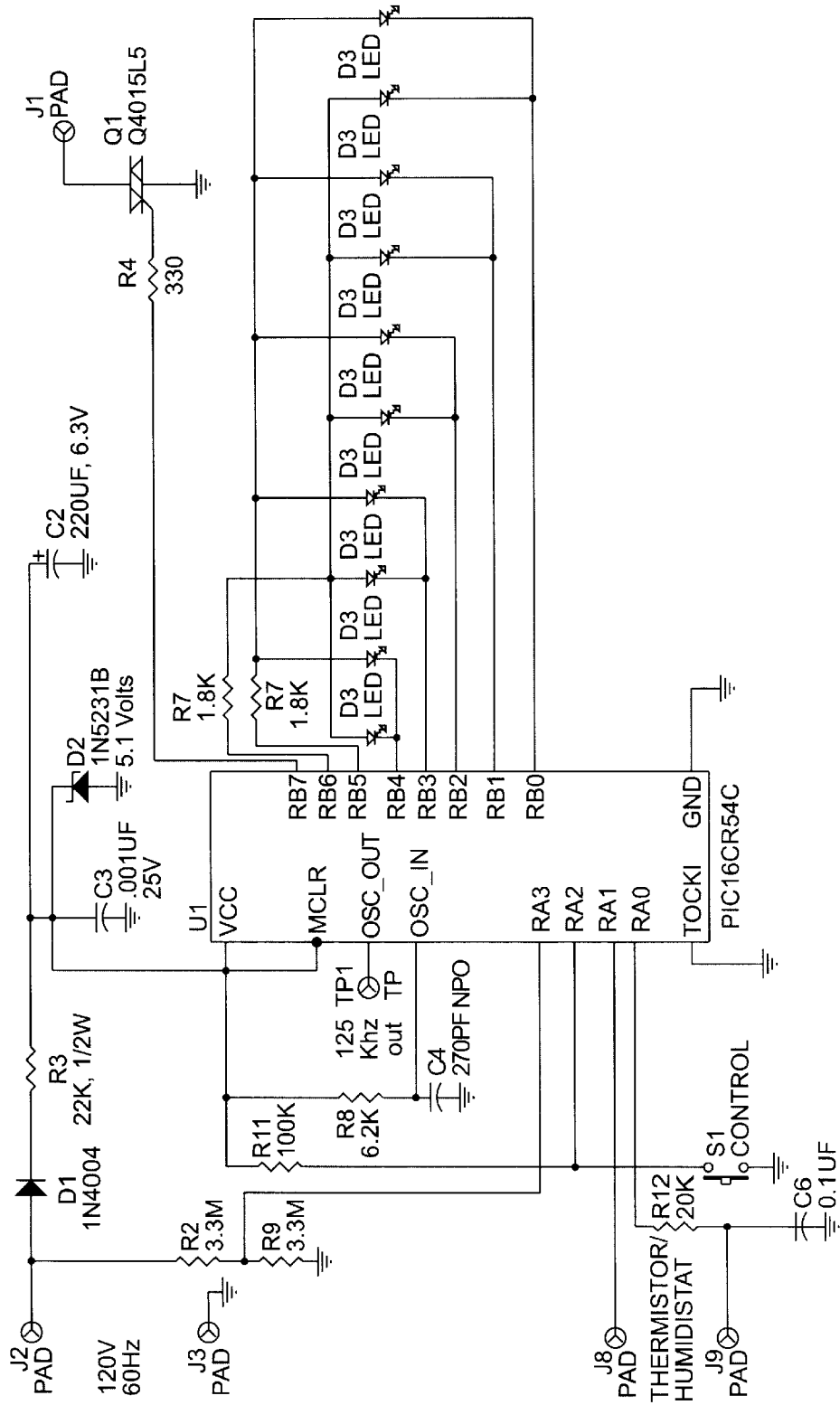
FIG. 8 is an electrical schematic of the electronic control circuit of the present invention utilizing a standard microcontroller.

FIG. 8 illustrates a similar electronic control circuit schematic to that of FIG. 7, except that the circuit utilizes a commonly available microprocessor rather than an ASIC. The circuit of FIG. 8 also includes a thermostat/humidistat sensor for sensing ambient temperature/humidity and a triac trigger circuit to provide power to the unit being operated.

As discussed above, the circuit of FIG. 8 is somewhat more complicated including additional electrical components to achieve the same results as the circuit using the ASIC. However, the operation of the circuit would be similar to that described above with respect to the heater circuits shown in FIGS. 3 and 7.

The electrical components and values illustrated in FIGS. 3, 4, 5, 7 and 8 are provided for illustrative purposes only. It is contemplated that other components arranged in a different manner can accomplish the functions attained in the present invention and fall within the scope thereof.

What is claimed is:

1. An apparatus for modifying ambient air conditions comprising:
   a housing,
   a fan assembly positioned within the housing and including a motor and a fan blade attached to a shaft of the motor; and
   an electronic control circuit electrically coupled to the motor, and adapted to provide power thereto, the electronic control circuit comprising a single switch to turn on operating power to the apparatus and to set a mode of operation to one of manual mode and automatic mode, wherein the single switch sets a plurality of pre-determined power levels of operation in manual mode, and further wherein the single switch selects a pre-set threshold ambient air condition in automatic mode, the electronic control circuit further including a sensor for sensing an ambient air condition and a means for comparing the pre-set threshold ambient air condition to the sensed ambient air condition, wherein the electronic control circuit provides power to the fan assembly motor to substantially achieve the pre-set threshold ambient air condition and terminates power to the fan assembly motor when the pre-set threshold ambient air condition is substantially attained when set in automatic mode.

2. The apparatus as defined in claim 1, wherein the switch is a push-button switch.

3. The apparatus as defined in claim 1, wherein the electronic control circuit includes a plurality of discretely incremented pre-set threshold ambient air condition values.

4. The apparatus as defined in claim 3, wherein each pre-set threshold ambient air condition value includes indicia associated therewith.

5. The apparatus as defined in claim 4, wherein the indicia comprises light emitting diodes.

6. The apparatus as defined in claim 1, wherein the predetermined power level of operation includes at least low and high.

7. The apparatus as defined in claim 1, wherein the electronic control circuit includes an application-specific integrated circuit to control power to the fan assembly motor and illuminate indicia associated with a mode of operation for said apparatus.

8. The apparatus as defined in claim 1, wherein the comparing means comprises a comparator circuit.

9. The apparatus as defined in claim 1, wherein the sensor comprises a thermistor and said apparatus is a fan.

10. The apparatus as defined in claim 1, further comprising a heating element electrically coupled to the electronic control circuit and wherein the sensor is a thermistor and the electronic control circuit controls operating power to the heating element and motor.

11. The apparatus as defined in claim 1, further comprising a wick filter element, wherein said housing includes a means for holding water in contact with the wick filter element, and wherein the sensor comprises a humidity sensor.

12. A method of operating an apparatus for modifying an ambient air condition, the apparatus including at least one of a heating element and a fan assembly comprising a motor and a fan blade coupled to a shaft of the motor, and an electronic control circuit electrically coupled to the at least heating element or motor for providing operating power thereto, the electronic control circuit including a single control switch and a sensor for sensing an ambient air condition, the method comprising the steps of:

actuating the single control switch to turn the apparatus on and off and to select a mode of operation to one of a manual mode and an automatic mode, wherein actuating the switch in the manual mode selects an operating power level and wherein actuating the switch in the automatic mode selects a pre-set threshold ambient air condition value;

providing operating power to one of the at least heating element and motor when in the manual mode;

comparing the pre-set threshold ambient air condition to the sensed ambient air condition when in the automatic mode;

providing operating power to one of the at least heating element and motor if the sensed ambient air condition is not substantially similar to the pre-set ambient air condition when the automatic mode; and terminating power to the at least heating element and motor when the pre-set threshold ambient air condition is substantially similar to the sensed ambient air condition when in the automatic mode.

13. The method as defined in claim 12, wherein the single control switch is a push-button switch and the step of actuating includes repeatedly pushing the push-button to progress through the modes of operation and pre-set threshold ambient air condition values.

14. The method as defined in claim 12, wherein the sensor is a thermistor and the apparatus is operated as a fan.

15. The method as defined in claim 12, wherein the sensor is a thermistor and the apparatus is a heater.

16. The method as defined in claim 12, further including a housing having a means for holding water and a wick filter in contact with water in the housing, and wherein the sensor is a humidity sensor and the apparatus is a humidifier.

17. The method as defined in claim 12, wherein the apparatus includes a housing having a means for holding water and a heating element for heating the water to form a mist, and wherein the sensor is a humidity sensor and the apparatus is a humidifier.

18. An electronic control circuit for operating a device for modifying ambient conditions comprising:

a single control switch for turning the device on and off and selecting a mode of operation, wherein in a manual mode, an operating power level is selected and wherein in an automatic mode one of a plurality of pre-set values is selected;

a sensor for sensing an ambient condition;

a comparator for comparing the sensed condition to the selected pre-set value in the automatic mode; and means for providing operating power to the device in response to the selected mode of operation and selected setting.

19. The electronic control circuit as defined in claim 17, wherein the single control switch is a push-button.

20. The electronic control circuit as defined in claim 17, wherein the means for providing operating power comprises an application-specific integrated circuit.

* * * * *